(12) United States Patent
Matsuo et al.

(10) Patent No.: US 8,168,030 B2
(45) Date of Patent: May 1, 2012

(54) MANUFACTURING METHOD OF LASER PROCESSED PARTS AND ADHESIVE SHEET FOR LASER PROCESSING

(75) Inventors: Naoyuki Matsuo, Ibaraki (JP); Masakatsu Urairi, Ibaraki (JP); Atsushi Hino, Ibaraki (JP)

(73) Assignee: Nitto Denko Corporation, Ibaraki-Shi, Osaka (JP)

( * ) Notice: Subject to any disclaimer, the term of this patent is extended or adjusted under 35 U.S.C. 154(b) by 526 days.

(21) Appl. No.: 11/331,465

(22) Filed: Jan. 13, 2006

(65) Prior Publication Data

US 2006/0157191 A1    Jul. 20, 2006

(30) Foreign Application Priority Data

Jan. 14, 2005   (JP) ................................. 2005-007275

(51) Int. Cl.
B32B 38/00 (2006.01)
B32B 38/04 (2006.01)
B26D 1/00 (2006.01)

(52) U.S. Cl. ........................ 156/272.8; 156/248; 156/250
(58) Field of Classification Search .................. 156/247, 156/248, 272.2, 272.8, 344, 250; 438/464
See application file for complete search history.

(56) References Cited

U.S. PATENT DOCUMENTS

| | | | |
|---|---|---|---|
| 5,169,678 A | 12/1992 | Cole et al. | |
| 5,271,946 A | 12/1993 | Hettche | |
| 5,278,199 A | 1/1994 | Ohkawa et al. | |
| 5,460,921 A | 10/1995 | Cywar et al. | |
| 5,493,096 A | 2/1996 | Koh | |
| 5,538,789 A | 7/1996 | Capote et al. | |
| 5,981,145 A | 11/1999 | Ding et al. | |
| 6,255,405 B1 | 7/2001 | Kang et al. | |
| 6,258,426 B1 | 7/2001 | Yamamoto et al. | |
| 6,407,363 B2 * | 6/2002 | Dunsky et al. | 219/121.71 |
| 6,413,839 B1 | 7/2002 | Brown et al. | |
| 6,444,310 B1 * | 9/2002 | Senoo et al. | 428/354 |
| 6,561,743 B1 | 5/2003 | Nakatsu | |
| 6,596,968 B2 | 7/2003 | Yamamoto et al. | |
| 6,610,960 B2 | 8/2003 | De Steur et al. | |
| 6,811,888 B2 | 11/2004 | Hamann et al. | |
| 6,864,459 B2 | 3/2005 | Chang et al. | |
| 7,586,060 B2 | 9/2009 | Urairi et al. | |

(Continued)

FOREIGN PATENT DOCUMENTS

EP    0 863 231 A1    9/1998

(Continued)

OTHER PUBLICATIONS

European Search Report issued on the corresponding European Patent Application No. EP06000526, dated Apr. 6, 2006.

(Continued)

*Primary Examiner* — Richard Crispino
*Assistant Examiner* — Daniel McNally
(74) *Attorney, Agent, or Firm* — Knobbe Martens Olson & Bear LLP (57) ABSTRACT

Providing a method of manufacturing a laser processed part capable of processing at high speed and high precision when processing a workpiece by optical absorption ablation of laser beam, effectively suppressing contamination of a workpiece surface by decomposition products, and recovering the workpiece easily after processing. Another object is to present an adhesive sheet for laser processing preferably used in the method of manufacturing a laser processed part.

8 Claims, 3 Drawing Sheets

U.S. PATENT DOCUMENTS

| | | | |
|---|---|---|---|
| 2002/0090493 A1 | 7/2002 | Kamada et al. | |
| 2002/0104831 A1* | 8/2002 | Chang et al. | 219/121.7 |
| 2002/0127824 A1* | 9/2002 | Shelton et al. | 438/463 |
| 2003/0108762 A1 | 6/2003 | Hamann et al. | |
| 2003/0207062 A1 | 11/2003 | Herzog et al. | |
| 2003/0226832 A1 | 12/2003 | Liu et al. | |
| 2004/0002199 A1 | 1/2004 | Fukuyo et al. | |
| 2004/0048054 A1 | 3/2004 | Tobita et al. | |
| 2004/0112880 A1 | 6/2004 | Sekiya | |
| 2005/0003635 A1* | 1/2005 | Takekoshi | 438/464 |
| 2005/0029238 A1 | 2/2005 | Chen | |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2005/0242073 A1 | 11/2005 | Nakamura et al. | |
| 2006/0040473 A1 | 2/2006 | Fukuyo et al. | |
| 2006/0160331 A1 | 7/2006 | Fukuyo et al. | |
| 2006/0222813 A1 | 10/2006 | Kato et al. | |
| 2006/0228650 A1 | 10/2006 | Matsuo et al. | |
| 2006/0246279 A1* | 11/2006 | Urairi et al. | 428/345 |
| 2007/0181543 A1 | 8/2007 | Urairi et al. | |

FOREIGN PATENT DOCUMENTS

| | | |
|---|---|---|
| EP | 0 976 802 | 2/2000 |
| EP | 1 634 673 A1 | 3/2006 |
| JP | 5-330046 | 12/1993 |
| JP | 6-163687 | 6/1994 |
| JP | 6-170822 | 6/1994 |
| JP | 7-168386 | 7/1995 |
| JP | 9-136421 | 5/1997 |
| JP | 9-188854 | 7/1997 |
| JP | 63-036988 | 2/1998 |
| JP | 2000-104026 | 4/2000 |
| JP | 2001-118862 | 4/2001 |
| JP | 2001-323075 | 11/2001 |
| JP | 2002-105221 | 4/2002 |
| JP | 2002-134921 | 5/2002 |
| JP | 2002-178181 | 6/2002 |
| JP | 2002-239766 | 8/2002 |
| JP | 2002-322438 | 11/2002 |
| JP | 2002-338911 | 11/2002 |
| JP | 2002-343747 | 11/2002 |
| JP | 2002-343747 A | 11/2002 |
| JP | 2003-23230 | 1/2003 |
| JP | 2003-33889 | 2/2003 |
| JP | 2003-34780 A | 2/2003 |
| JP | 2003-113355 | 4/2003 |
| JP | 2003-173988 | 6/2003 |
| JP | 2003-179360 | 6/2003 |
| JP | 2003-211277 | 7/2003 |
| JP | 2004-91547 A | 3/2004 |
| JP | 2004-122182 | 4/2004 |
| JP | 2004-188475 | 7/2004 |
| JP | 2004-230391 | 8/2004 |
| JP | 2004-311848 | 11/2004 |
| JP | 2004-322157 | 11/2004 |
| JP | 2005-186109 | 7/2005 |
| JP | 2005-186110 | 7/2005 |
| JP | 2005-187619 | 7/2005 |
| JP | 2005-279676 | 10/2005 |
| JP | 2005-279680 | 10/2005 |
| JP | 2005-279682 A | 10/2005 |
| JP | 2005-279692 | 10/2005 |
| JP | 2005-279696 | 10/2005 |
| JP | 2005-279698 | 10/2005 |
| JP | 2005-279749 | 10/2005 |
| JP | 2005-279752 | 10/2005 |
| JP | 2005-279754 | 10/2005 |
| JP | 2005-279755 | 10/2005 |
| JP | 2005-279757 | 10/2005 |
| JP | 2005-279758 | 10/2005 |
| JP | 2006-192474 | 7/2006 |
| JP | 2006-192478 | 7/2006 |
| WO | WO 01/41968 | 6/2001 |
| WO | WO 03/028949 | 4/2003 |
| WO | WO 2004096483 A1 * | 11/2004 |
| WO | WO 2005/063435 | 7/2005 |

OTHER PUBLICATIONS

International Search Report issued on the related PCT Application No. PCT/JP2004/005554, dated Aug. 10, 2004.

International Search Report issued on the related PCT Application No. PCT/JP2004/016268, dated Feb. 15, 2005.

File History of the related U.S. Appl. No. 10/554,540, as of Oct. 13, 2008.

File History of the related U.S. Appl. No. 11/331,674, as of Oct. 13, 2008.

File History of the related U.S. Appl. No. 10/584,825, as of Oct. 13, 2008.

File History of the related U.S. Appl. No. 10/554,540, for the period of Oct. 14, 2008-Nov. 11, 2008.

File History of the related U.S. Appl. No. 11/331,674, for the period of Oct. 14, 2008-Nov. 11, 2008.

File History of the related U.S. Appl. No. 10/584,825, for the period of Oct. 14, 2008-Nov. 11, 2008.

File History of the related U.S. Appl. No. 11/331,674, for the period of Nov. 12, 2008-Jun. 15, 2009.

File History of the related U.S. Appl. No. 10/584,825, for the period of Apr. 16, 2009-Jun. 15, 2009.

File History of the related U.S. Appl. No. 10/554,540, for the period of Nov. 12, 2008-Apr. 15, 2009.

File History of the related U.S. Appl. No. 10/584,825, for the period of Nov. 12, 2008-Apr. 15, 2009.

File History of the related U.S. Appl. No. 10/554,540, for the period of Apr. 16, 2009-Sep. 21, 2009.

File History of the related U.S. Appl. No. 11/331,674, for the period of Jun. 16, 2009-Sep. 21, 2009.

File History of the related U.S. Appl. No. 10/584,825, for the period of Jun. 16, 2009-Sep. 21, 2009.

Japanese Office Action issued on the corresponding Japanese Patent Application No. 2005-007275, dated Dec. 22, 2009.

File History of the related U.S. Appl. No. 10/554,540, for the period of Jun. 18, 2010-Jul. 31, 2010.

File History of the related U.S. Appl. No. 12/820,375, as of Jul. 31, 2010.

File History of the related U.S. Appl. No. 11/331,674, as of Jun. 18, 2010-Jul. 31, 2010.

File History of the related U.S. Appl. No. 10/584,825, as of Jun. 18, 2010-Jul. 31, 2010.

File History of the related U.S. Appl. No. 10/554,540, for the period of Sep. 22, 2009-Jun. 17, 2010.

File History of the related U.S. Appl. No. 11/331,674, for the period of Sep. 22, 2009-Jun. 17, 2010.

File History of the related U.S. Appl. No. 10/584,825, for the period of Sep. 22, 2009-Jun. 17, 2010.

* cited by examiner

MANUFACTURING METHOD OF LASER PROCESSED PARTS AND ADHESIVE SHEET FOR LASER PROCESSING

TECHNICAL FIELD

The invention relates to a manufacturing method of laser processed parts obtained by processing workpieces such as sheet material, circuit board, semiconductor wafer, glass substrate, ceramic substrate, metal substrate, semiconductor laser or other light emitting and light detecting element board, MEMS board, semiconductor package, cloth, leather, paper or the like, by cutting, drilling, marking, grooving, scribing, trimming or other shaping process by ultraviolet absorption ablation by laser beam. The present invention also relates to an adhesive sheet for laser processing used when processing a workpiece by ultraviolet absorption ablation by laser beam.

BACKGROUND ART

As the electronic and electric appliances are reduced in size recently, component parts are also reduced in size and advanced in definition, and high definition and high precision are demanded in machining of parts at machining precision of ±50 μm or less. In the conventional press processing or blanking process, the precision is about ±100 μm at most, and such demand cannot be satisfied. Drilling of materials is also demanded to conform to high definition and high precision, and drilling by using conventional drill or die cannot meet the needs.

As the solving method, recently, processing methods of various materials by using a laser beam have been gaining attention. Examples of such a technology include a method of dicing a workpiece by a laser beam by supporting and fixing the workpiece on a dicing sheet (Japanese Patent Application Laid-Open No. 2002-343747). The dicing sheet disclosed therein includes a base material having a support sheet, and an adhesive layer disposed on one side of the base material, where the adhesive layer can be cut off by the laser beam, and the support sheet cannot be cut off by the laser beam.

Another proposed method is to dice a semiconductor wafer by combining a laser with a water microjet (Japanese Patent Application Laid-Open No. 2003-34780). As a proposed adhesive tape for laser dicing proposed therein, a non-radiation curing type adhesive layer and a radiation curing type adhesive layer are formed on one side of the base material, where the base material is transmissive of a jet stream of the water jet, and the non-radiation curing type adhesive layer is disposed between the base material and radiation curing type adhesive layer.

When a laser beam is used, however, decomposition products of carbon and others generated from the workpiece, adhesive tape and a adsorption board at the time of laser processing deposit on the surface of the workpiece, and post-processing called desmearing is needed for removing them. Adhesion strength of the decomposition products becomes stronger in proportion to the power of the laser beam, and when the laser beam power is increased, it tends to be difficult to remove the decomposition products in postprocessing. Accordingly, a problem has been noted that an improvement of processing throughput by increasing the laser power may be hindered, or processing precision may be lowered. Moreover, if the dicing sheet is also cut off when cutting the workpiece, the laser processed part drops off. Therefore, there is also a problem that a certain portion must be kept uncut when cutting, which makes the handling performance poor.

When using the dicing sheet disclosed in Japanese Patent Application Laid-Open No. 2002-343747, the adhesive layer is thermally cut off by the fundamental wave of YAG laser (wavelength 1064 nm) or a laser beam of ruby laser (wavelength 694 nm), and decomposition products of an adhesive layer may invade into the interface between the dicing sheet and the workpiece, and may stick stubbornly to the interface area. As a result, there is a problem that it is hard to remove the dicing sheet from the workpiece after laser processing, or laser-processing precision is lowered.

In the case of the adhesive tape disclosed in Japanese Patent Application Laid-Open No. 2003-34780, when the water microjet and the laser are combined and used in dicing of semiconductor wafer, thermal damage of adhesive tape is decreased by cooling effect of water jet, and it may be expected to suppress dissolving or decomposing of the adhesive layer or the base material due to heat by laser irradiation. However, when the adhesive tape is applied in a method of dicing a semiconductor wafer by using only a laser, due to the heat by the laser irradiation, the adhesive layer or base material may be dissolved, and decomposition products of the adhesive layer and the base material may invade into the interface between the adhesive sheet and the semiconductor wafer, sticking stubbornly to the interface area, and similar problems may occur. Further, when water microjet is used, there is a limit in reducing the cutting width since the cutting width in dicing is defined by the diameter of the water jet, and thus it is inferior in the aspect of manufacturing efficiency of semiconductor chip.

SUMMARY OF THE INVENTION

An object of the present invention to provide a method of manufacturing a laser processed part capable of processing at high precision and high speed when processing a workpiece by optical absorption ablation of a laser beam, effectively suppressing contamination of a workpiece surface by decomposition products, and easily recovering the workpiece after processing. It is another object to provide an adhesive sheet for laser processing used in the method of manufacturing the laser processed part.

The present inventors have intensively accumulated studies in order to solve the problems, and have completed the invention by discovering that the objects can be achieved by the manufacturing method of laser processed parts by using the following adhesive sheet for laser processing (hereafter called adhesive sheet).

Specifically the present invention relates to a method of manufacturing a laser processed part using an adhesive sheet for laser processing having at least an adhesive layer on a base material, with an extinction coefficient ratio less than 1, the extinction coefficient ratio being an extinction coefficient of adhesive sheet for laser processing at wavelength 532 nm divided by an extinction coefficient of a workpiece to be processed at wavelength 532 nm, the method including the steps of adhering the adhesive layer of the adhesive sheet for laser processing to a laser beam emitting side of the workpiece; processing the workpiece by irradiating a laser beam; and removing the adhesive sheet for laser processing from the processed workpiece.

The above adhesive sheet for laser processing is stacked up at an adsorption stage side (laser beam exit side) of the workpiece before laser processing of the workpiece by optical absorption ablation of the laser beam, and is used for fixing and supporting the workpiece (laser processed part) during the process and the subsequent steps.

An adhesive sheet has at least an adhesive layer on a base material. By using an adhesive sheet, tightness of interface of adhesive sheet and workpiece is enhanced, and invasion of decomposition product into interface can be suppressed, and thereby contamination of workpiece surface by decomposition product can be suppressed.

In the manufacturing method of the present invention, it is required to select and use an adhesive sheet of which extinction coefficient ratio (extinction coefficient of adhesive sheet for laser processing at wavelength 532 nm/extinction coefficient of workpiece at wavelength 532 nm) is less than 1. The present inventors found correlation between the extinction coefficient and laser processing performance, and discovered that contamination of surface of workpiece by decomposition product can be effectively suppressed by using the adhesive sheet of which extinction coefficient ratio is less than 1.

The extinction coefficient ratio is an important parameter for laser processing of adhesive sheet and workpiece. The smaller the extinction coefficient of a solid matter at a certain wavelength, the smaller is absorption of light energy. That is, optical absorption in a solid matter occurs in light invasion length (effective distance from solid surface: 1/extinction coefficient), and when extinction coefficient is small, light invasion length is long, and accumulated energy per unit volume is small. Hence, laser processing is difficult in a material of small extinction coefficient.

By using the adhesive sheet of the present invention, where an extinction coefficient ratio is less than 1, an invasion length of the laser beam in the adhesive sheet can be set longer than the invasion length of the laser beam in the workpiece. As a result, absorption of light energy is greater in the workpiece than in the adhesive sheet, and the workpiece is more easily processed by a laser. In the present invention, it is preferred to use an adhesive sheet with extinction coefficient ratio of 0.9 or less, more preferably 0.8 or less, or most preferably 0.5 or less.

If an adhesive sheet with an extinction coefficient ratio of 1 or more is used, laser energy utilization efficiency of the adhesive sheet is large, and etching of the adhesive sheet progresses faster in comparison with the workpiece. As a result, decomposition products caused by etching of the base material or the adhesive layer or the decomposition products of the adsorption board provided on the adsorption stage may invade into the interface between the adhesive sheet and the workpiece, and the workpiece surface may be contaminated. When the workpiece surface is contaminated by the decomposition products, it may be hard to remove the adhesive sheet from the workpiece after the laser processing of the workpiece, or it may be hard to remove the decomposition products in postprocessing, and the processing precision of the workpiece tends to decline.

In the manufacturing method of laser processed part of the present invention, preferably, the workpiece is one of a sheet material, a circuit board, a semiconductor wafer, a glass substrate, a ceramic substrate, a metal substrate, a semiconductor laser light emitting or receiving element substrate, an MEMS substrate, and a semiconductor package.

Another aspect of the present invention relates to a method of manufacturing a laser processed part using an adhesive sheet for laser processing that includes at least an adhesive layer on a base material, and whose extinction coefficient at wavelength 532 nm is less than 20 $cm^{-1}$, the method comprising the steps of adhering the adhesive layer of the adhesive sheet for laser processing to a laser beam emitting side of a metal material; processing the metal material by irradiating a laser beam; and removing the adhesive sheet for laser processing from the processed metal material.

When processing a metal material, in particular, it is hard to measure the extinction coefficient of metal material. However, by using an adhesive sheet of which extinction coefficient at wavelength 532 nm of less than 20 $cm^-$, contamination of metal material surface by decomposition product can be suppressed effectively. The extinction coefficient at wavelength 532 nm of adhesive sheet is preferably 19 $cm^{-1}$ or less, or more preferably 18 $cm^{-1}$ or less.

In the other aspect of the present invention, the metal material is one of a semiconductor wafer and a metal substrate.

In the present invention, preferably, the base material is made of a resin without containing aromatic hydrocarbon group. By using a resin that does not contain aromatic hydrocarbon group, the extinction coefficient of the base material can be decreased, and the laser processability of the base material is further lowered.

Preferably, the adhesive layer of the adhesive sheet is formed of an adhesive agent without containing a compound having aromatic hydrocarbon group. By using an adhesive agent that does not contain a compound having aromatic hydrocarbon group, the extinction coefficient of the adhesive layer can be decreased, and the laser processability of the adhesive layer is further lowered. The adhesive agent contains at least a base polymer, and the base polymer preferably does not contain aromatic hydrocarbon group. When using various additives such as crosslinking agent, ultraviolet absorber, antioxidant, and photopolymerization initiator, it is preferred to use additives that does not contain aromatic hydrocarbon group.

In the manufacturing method of laser processed part of the present invention, preferably, the processing is cutting or drilling.

The invention relates to the adhesive sheet for laser processing used in manufacturing method of laser processed parts. The adhesive sheet is preferably used when manufacturing semiconductor chips, in particular, by dicing a semiconductor wafer.

BEST MODE FOR CARRYING OUT THE INVENTION

As a laser used in the present invention, such a laser is used that emits light at wavelength 532 nm such as Nd:YAG laser second harmonic expected to process at high precision with high throughput by high power output, without worsening the precision or appearance of hole edge or cut section wall of workpiece by thermal damage in laser processing.

The workpiece is not particularly specified as far as it can be processed by ultraviolet absorption ablation of laser beam emitted from the laser, and may include, among others, sheet material, circuit board, semiconductor wafer, glass substrate, ceramic substrate, metal substrate, semiconductor laser or other light emitting or light detecting element board, MEMS (micro electro mechanical system) board, semiconductor package, cloth, leather, and paper.

The protective sheet and manufacturing method of the invention are preferably applied particularly in processing of sheet material, circuit board, semiconductor wafer, glass substrate, ceramic substrate, metal substrate, semiconductor laser light emitting or light detecting element board, MEMS board, and semiconductor package.

Various sheet materials include, for example, macromolecular films and nonwoven cloths made of polyimide resin, polyester resin, epoxy resin, urethane resin, polystyrene resin, polyethylene resin, polyamide resin, polycarbonate resin, silicone resin, fluorine resin, etc., and further sheets made of such resins provided with physical or optical functions by drawing, impregnation or other processes, metal sheets of copper, aluminum, stainless steel, and others, and the macromolecular film and/or metal sheet laminated directly or by way of adhesive or the like.

Examples of the circuit board include one-side, double-side or multi-layer flexible printed board, rigid board of glass epoxy, ceramic or metal core substrate, and optical circuit or opto-electrical mixed circuit board formed on glass or polymer.

Metal materials include both semimetals and alloys, for example, gold, SUS, copper, iron, aluminum, stainless steel, silicon, titanium, nickel, tungsten, zirconia and their processed materials (semiconductor wafer, metal board, etc.).

In the manufacturing method of laser processed part of the present invention, an adhesive sheet having at least an adhesive layer on a base material is used. It is required to select and use an adhesive sheet of which extinction coefficient ratio is less than 1. On the other hand, for laser processing of metal material, it is required to select and use an adhesive sheet of which extinction coefficient at wavelength 532 is less than 20 $cm^{-1}$.

Examples of a forming material of the base material include polyethylene terephthalate; polyethylene naphthalate; polystyrene; polycarbonate; polyimide; (meth)acrylic polymer; polyurethane resin; polynorbornene resin; polyethylene glycol, polytetramethylene glycol and other polyalkylene glycol resins; silicone rubber; polyethylene, polypropylene, polybutadiene, polyvinyl alcohol, polymethyl pentene, ethylene-vinyl acetate copolymer and other polyolefin resins, but is not limited to them alone. Among the above, in particular, it is preferred to use resins not containing aromatic hydrocarbon group, and, in particular, (meth)acrylic polymer and polyolefin resin are preferred.

The base material may be either a single layer or plural layers. It may be formed in a membrane or a mesh shape. In particular, the base material having a large degree of porosity is preferred, such as a fibrous form of resin, a nonwoven fabric, a woven fabric, or a porous structure.

Thickness of the base material may be properly adjusted within a range not spoiling the ease or efficiency of work at each step such as gluing to the workpiece, cutting or drilling of the workpiece, and removing and recovery of laser processed part, and is usually 500 μm or less, preferably 3 to 300 μm, or more preferably 5 to 250 μm. Surface of base material may be treated as usual for enhancing contact tightness with adjacent material such as adsorption board or shape retaining property, by, for example, chromate treatment, ozone exposure, flame exposure, high voltage electric shock exposure, ionization radiation treatment, other chemical or physical treatment, or undercoat agent (for example, using adhesive material described below), and other coating treatment.

Forming materials of adhesive layer include known adhesive materials including (meth)acrylic polymer and rubber polymer.

Monomer components for forming (meth)acrylic polymer are alkyl (meth)acrylates having alkyl radical of straight chain or branch chain with 30 carbon atoms or less, or preferably 3 to 18 carbon atoms, including, for example, methyl radical, ethyl radical, n-propyl radical, isopropyl radical, n-butyl radical, t-butyl radical, isobutyl radical, amyl radical, isoamyl radical, hexyl radical, heptyl radical, cyclohexyl radical, 2-ethyl hexyl radical, octyl radical, iso-octyl radical, nonyl radical, isononyl radical, decynol radical, isodecyl radical, undecyl radical, lauryl radical, tridecyl radical, tetradecyl radical, stearyl radical, octadecyl radical, and dodecyl radical. These alkyl (meth)acrylates may be used either alone or in combination of two or more types.

In order to modify the adhesiveness, coagulation or heat resistance of (meth)acrylic polymer, other monomer components than mentioned above may be copolymerized as required. Other monomers capable of forming such polymers include, for example, acrylic acid and methacrylic acid, carboxyethylacrylate and carboxypentylacrylate, itaconic acid and maleic acid, fumaric acid and crotonic acid or other monomer containing carboxyl radical, maleic anhydride and itaconic anhydride or other monomer of acid anhydride, (meth)acrylic acid 2-hydroxyl ethyl and (meth)acrylic acid 2-hydroxyl propyl, (meth)acrylic acid 4-hydroxyl butyl and (meth)acrylic acid 6-hydroxylhexyl, (meth)acrylic acid 8-hydroxyoctyl and (meth)acrylic acid 10-hydroxyl decyl, (meth) acrylic acid 12-hydroxylauryl and (4-hydroxymethyl cyclohexyl)-methylacrylate or other monomer containing hydroxyl radical, allyl sulfonic acid, 2-(meth)acrylic amide-2-methyl propane sulfonic acid, (meth)acrylic amide propane sulfonic acid, and sulfopropyl (meth)acrylate or other monomer containing sulfonic acid radical, 2-hydroxy ethyl acryloyl phosphate or other monomer containing phosphoric acid radical, etc. These monomer components may be used either alone or in combination of two or more types.

In addition, for the purpose of crosslinking of acrylic polymer or the like, multifunctional monomers and the like may be added as required as monomer component for copolymerization.

Examples of such monomer include hexane diol di(meth) acrylate, (poly)ethylene glycol di(meth)acrylate, (poly)propylene glycol di(meth)acrylate and neopentyl glycol di(meth) acrylate, pentaerythritol di(meth)acrylate, trimethylol propane tri(meth)acrylate, tetramethylol methane tetra(meth) acrylate, pentaerythritol tri(meth)acrylate, pentaerythritol tetra(meth)acrylate, dipentaerythritol monohydroxy penta (meth)acrylate, dipentaerythritol hexa(meth)acrylate, epoxy (meth)acrylate, polyester(meth)acrylate, urethane (meth) acrylate, and others. One type or two or more types of multifunctional monomer may be used.

The content of multifunctional monomer is preferred to be 30 wt % or less of the total monomer content from the viewpoint of adhesiveness and others, and more preferably 20 wt % or less.

To prepare (meth)acrylic polymer, various methods may be applied, for example, solution polymerization method of mixture containing one, two or more types of monomer components, emulsification polymerization method, block polymerization, and suspension polymerization method.

Polymerization initiator includes peroxides such as hydrogen peroxide, benzoyl peroxide, and t-butyl peroxide. It is preferred to use alone, but it may be combined with reducer to be used as redox polymerization initiator. The reducer includes sulfite, hydrogen sulfite, iron, copper, cobalt salt, or other ionized salt, triethanolamine and other amines, aldose, ketose, and other reducing sugar. An azo compound is also a preferred polymerization initiator, and its example includes 2,2'-azobis-2-methylpropio amidinate, 2,2'-azobis-2,4-dimethyl valeronitrile, 2,2'-azobis-N,N'-dimethylene isobutyl amidinate, 2,2'-azobis isobutyronitrile, and 2,2'-azobis-2-methyl-N-(2-hydroxy ethyl) propione amide. Two or more types of these polymerization initiators may be used in combination.

Reaction temperature is usually about 50 to 85° C., and the reaction time is about 1 to 8 hours. Among the manufacturing method, solution polymerization is preferred, and as solvent of (meth)acrylic polymer, generally, ethyl acetate, toluene, and other polar solvents are used. The solution concentration is generally about 20 to 80 wt %.

The adhesive agent may be properly combined with a crosslinking agent for raising the number-average molecular weight of (meth)acrylic polymer used as base polymer. Examples of crosslinking agent include polyisocyanate compound, epoxy compound, aziridine compound, melamione resin, urea resin, anhydrous compound, polyamine, and polymer containing carboxyl radical. When the crosslinking agent is used, its content must be determined so that the peel adhesive strength may not be lowered too much, and generally it is preferred to add by about 0.01 to 5 parts by weight in 100 parts by weight of base polymer. The adhesive agent for forming the adhesive layer may be also combined with other known additives as required, in addition to the specified components, such as ultraviolet absorbent, antioxidant, adhesion improver, aging retardant, filler, coloring matter, and others.

To improve peeling from workpiece, the adhesive agent is preferred to be radiation curing type adhesive which is cured by radiation such as ultraviolet ray or electron ray. When a radiation curing type adhesive is used as the adhesive agent, since the adhesive layer is irradiated with radiation after laser processing, the base material is preferred to have a sufficient radiation transmissivity.

Radiation curing type adhesive is not particularly specified as far as it has a radiation curing type functional group such as carbon-carbon double bond and shows adhesiveness. Radiation curing type adhesive includes, for example, radiation curing type adhesive having radiation curing monomer component or oligomer component blended to the (meth)acrylic polymer.

Examples of monomer component or oligomer component of radiation curing type to be blended include urethane(meth)acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, and others. One type or two or more types of monomer component or oligomer component may be used.

The blending amount of radiation curing monomer component or oligomer component is not particularly specified, but considering the adhesiveness, it is preferred to add by about 5 to 500 parts by weight in 100 parts by weight of base polymer such as (meth)acrylic polymer for composing the adhesive agent, and more preferably by about 70 to 150 parts by weight.

As the radiation curing type adhesive, further, a base polymer having carbon-carbon double bond in the polymer side chain, main chain or main chain end may be used. Such base polymer is preferred to have (meth)acrylic polymer as basic skeleton. In this case, radiation curing type monomer component or oligomer component may not be added, and its use is free.

Radiation curing type adhesive contains photopolymerization initiator when desired to be hardened by ultraviolet rays or the like. Such photopolymerization initiator includes camphor quinone, ketone halide, acyl phosphino oxide, and acyl phosphonate.

The content of photopolymerization initiator is preferred to be about 0.1 to 10 parts by weight in 100 parts by weight of base polymer such as (meth)acrylic polymer for composing the adhesive agent, or more preferably about 0.5 to 5 parts by weight.

The adhesive sheet can be manufactured by applying an adhesive solution on the surface of a base material, and drying (or heating and crosslinking as required) to form an adhesive layer. Alternatively, an adhesive layer may be separately formed on a peeling liner, and it may be adhered to the base material. As required, a separator may be formed on the surface of the adhesive layer.

The adhesive layer is preferred to be low in content of low molecular substance from the viewpoint of prevention of contamination on workpiece. From such point of view, the number-average molecular weight of (meth)acrylic polymer is preferred to be 500,000 or more, more preferably 800,000 to 3,000,000.

Thickness of adhesive layer may be properly selected within a range not being separated from the workpiece, and is usually 5 to 300 µm, preferably 10 to 100 µm, or more preferably 20 to 50 µm.

The adhesive strength of adhesive layer is preferred to be 20 N/20 mm or less on the basis of adhesive strength (90-degree peel value, peeling speed 300 mm/min) at ordinary temperature (before laser emission) on SUS304, and more preferably 0.001 to 10 N/20 mm, or further preferably 0.01 to 8 N/20 mm.

The separator is used as required for protecting label processing or adhesive layer. The material for the separator includes paper, polyethylene, polypropylene, polyethylene terephthalate, and other synthetic resin film. The surface of the separator may be properly treated for improving the peeling performance from the adhesive layer by, for example, silicone treatment, long-chain alkyl treatment, fluorine treatment or other peeling treatment. As required, further, ultraviolet transmission preventive treatment may be applied to prevent the adhesive sheet from reacting by environmental ultraviolet rays. The thickness of the separator is usually 10 to 200 µm, preferably about 25 to 100 µm.

Figure 1:
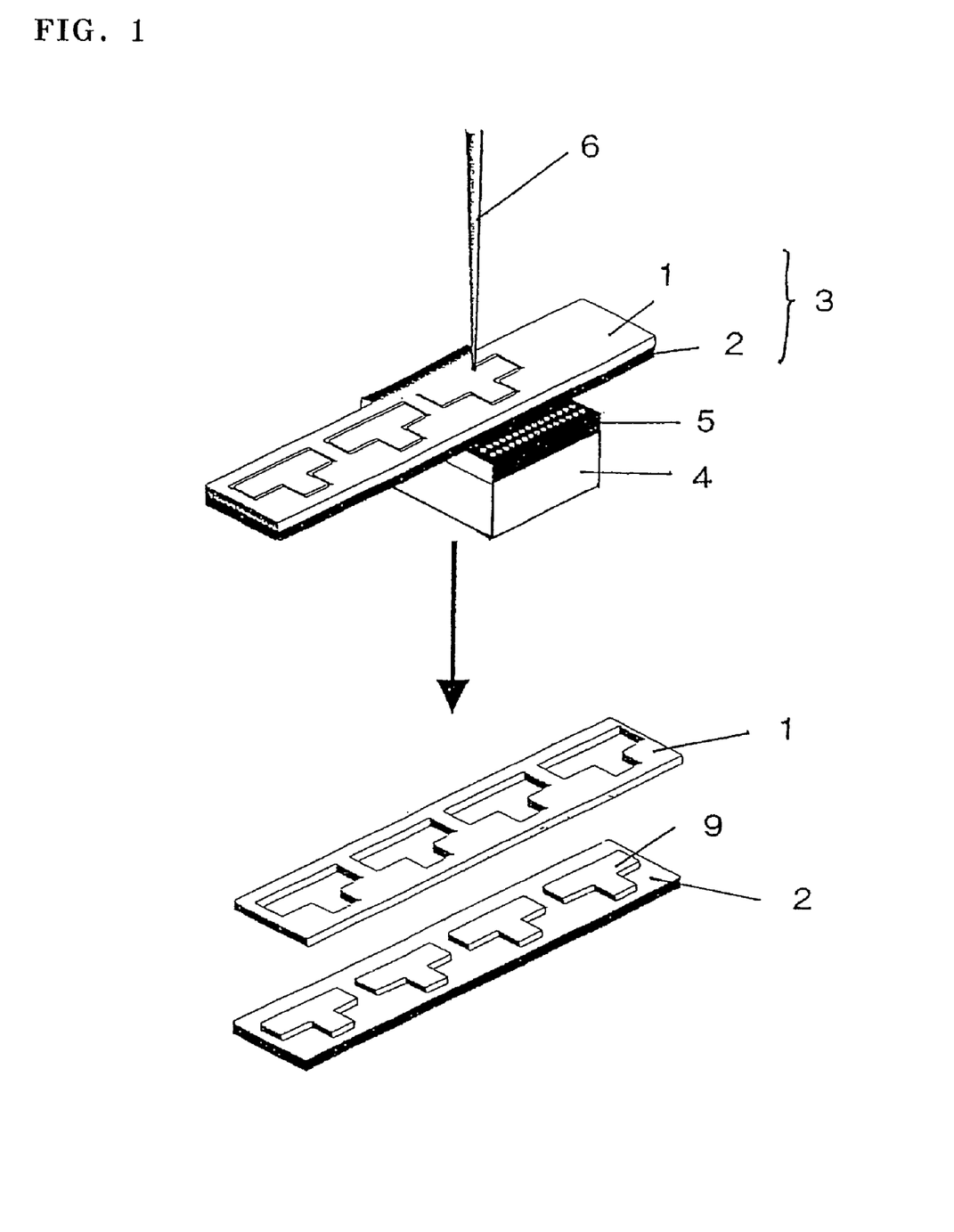
FIG. 1 is a schematic process diagram showing an example of manufacturing method of laser processed parts according to the invention.
Figure 3:
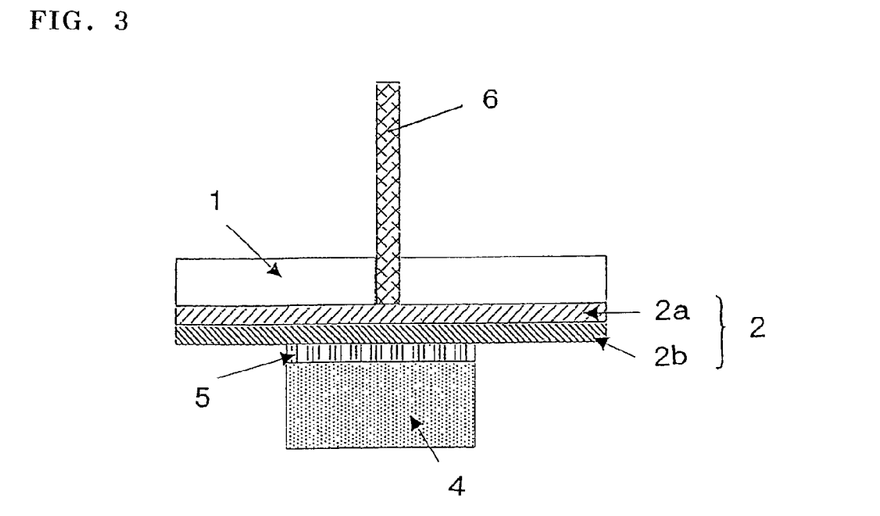
FIG. 3 is a schematic diagram showing a section of a laminated body processed by ultraviolet absorption ablation of laser beam.

The following explains a method of manufacturing a laser processed part by optical absorption ablation of laser beam, by using adhesive sheet with extinction coefficient ratio of less than 1 (or adhesive sheet with extinction coefficient at wavelength 532 nm of less than 20 cm$^{-1}$). For example, in the case of cutting process, as shown in FIG. 1 and FIG. 3, a workpiece-adhesive sheet laminated element 3 obtained by gluing adhesive sheet for laser processing 2 and a workpiece (or metal material) 1 by roll laminator, press or other known means is placed on an adsorption board 5 of an adsorption stage 4, and the workpiece 1 is illuminated with laser beam 6 emitted from specified laser oscillator by means of a lens, and the laser emitting position is moved along a specified processing line, and the workpiece 1 is cut off. The adhesive sheet 2 disposed at the laser beam exit side of workpiece 1 plays a role of supporting and fixing the workpiece 1 before laser processing, and a role of preventing the cut piece from dropping out after laser processing. A protective sheet may be provided at the laser beam incident side of the workpiece 1. The protective sheet is intended to prevent decomposition products or scattering matter generated by laser processing of workpiece 1 from sticking to the surface of the workpiece 1.

Laser beam moving means includes galvano scan, X-Y stage scan, mask image processing, and other known laser processing method.

The laser processing condition is not particularly specified as far as the workpiece 1 can be cut off completely, but in order to prevent cutting of adhesive sheet 2, it is preferred to control within 2 times of energy condition for cutting the workpiece 1.

The cutting allowance (section groove) can be narrowed by reducing the beam diameter of focusing unit of laser beam, but in order to enhance the section end precision, it is preferred to satisfy the condition of beam diameter (μm)>2× (laser beam moving speed (μm/sec)/ laser beam repetition frequency (Hz)).

Figure 2:
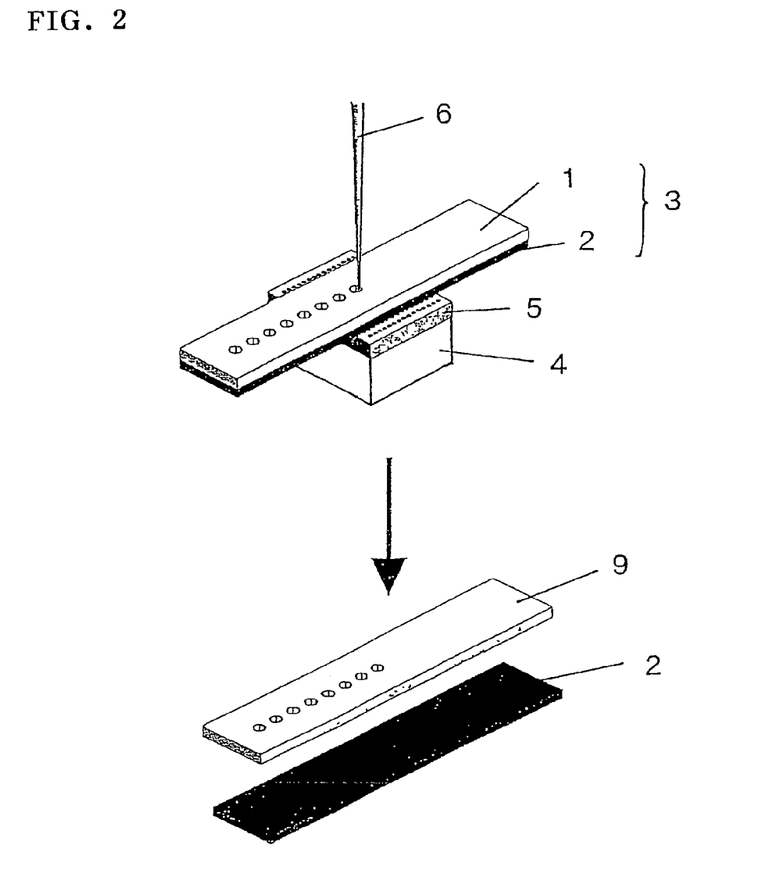
FIG. 2 is a schematic process diagram showing other example of manufacturing method of laser processed parts according to the invention.

In the case of drilling process, as shown in FIG. 2, the workpiece-adhesive sheet laminated element 3 obtained by gluing the workpiece 1 and adhesive sheet for laser processing 2 by roll laminator, press or other known means is placed on an adsorption board 5 of an adsorption stage 4, and the workpiece 1 is illuminated with laser beam 6 emitted from specified laser oscillator by means of a lens, and a hole is formed.

The hole is formed by known laser processing method such as punching by galvano scan, X-Y stage scan, mask imaging. The laser processing condition may be determined at the optimum value on the basis of the ablation threshold of workpiece.

Efficiency of scattering and removing decomposition products can be enhanced by blowing gas of helium, nitrogen or oxygen to the laser processing part. Protective sheet may be provided at laser beam incident side of the workpiece 1.

Figure 4:
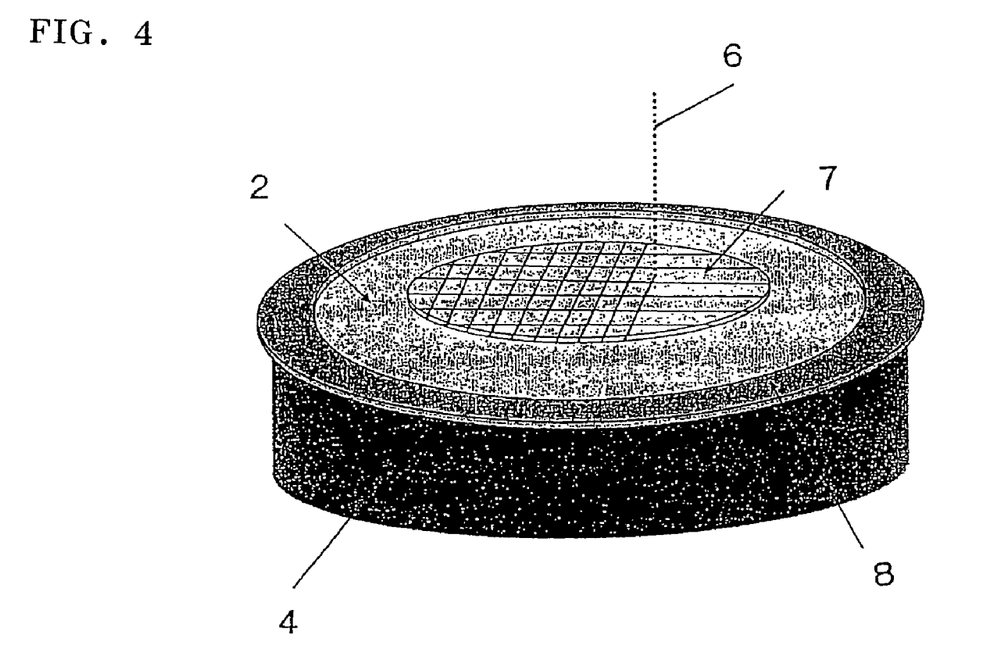
FIG. 4 is a schematic diagram showing an example of dicing method of semiconductor wafer.

In the case of cutting process (dicing process) of semiconductor wafer, as shown in FIG. 4, one side of semiconductor wafer 7 is adhered to the adhesive sheet for laser processing 2 provided on the adsorption stage 4, and laser beam 6 radiated from specified laser oscillator is emitted to semiconductor wafer 7 by means of lens, and the laser emitting position is moved along the specified processing line to cut off. Moving means of laser beam includes known laser processing method such as galvanoscan, X-Y stage scan, mask, and imaging. Processing condition of semiconductor wafer is not particularly specified as far as the semiconductor wafer 7 is cut off and the adhesive sheet 2 is not cut off. Protective sheet may be provided at laser beam incident side of semiconductor wafer 7.

In such dicing process of semiconductor wafer, after cutting into individual semiconductor chips (laser processed parts), the individual semiconductor chips can be picked up and collected by known methods such as the method of picking up by using a poking pin called needle by a conventional die bonder or other device, or a method disclosed in Japanese Laid-open Patent No. 2001-118862.

In the method of manufacturing a laser processed part of the present invention, the adhesive sheet 2 is removed after laser processing, and laser processed part 9 is recovered. The peeling method is not particularly specified, but it is important not to apply stress to cause permanent set of laser processed part 9 at the time of peeling. For example, when radiation curing type adhesive agent is used in adhesive layer of the adhesive sheet 2, the adhesive layer is cured by radiation emission depending on the type of adhesive agent, and the adhesion is lowered. By emission of radiation, adhesion of adhesive layer is lowered by curing, and peeling becomes easier. Emitting means of radiation is not specified, but ultraviolet irradiation or the like is preferred.

In the method of manufacturing a laser processed part of the present invention, adhesive sheet for laser processing with extinction coefficient ratio of less than 1 (or adhesive sheet for laser processing with extinction coefficient at wavelength 532 nm of less than 20 cm$^{-1}$) is used, it is hardly etched by laser beam. It is hence effective to suppress contamination by decomposition products in interface area of adhesive sheet for laser processing and the workpiece. According to this manufacturing method, therefore, decomposition products hardly stick to the interface area of adhesive sheet for laser processing and the workpiece (laser processed part), and the adhesive sheet can be easily separated from the laser processed part after laser processing of the workpiece. At the same time, laser-processing precision of the workpiece is enhanced. If decomposition products deposit, they can be easily removed by postprocessing, and postprocessing can be substantially simplified. Further, by enhanced power of laser, the throughput can be improved.

EXAMPLES

Exemplary embodiments of the invention are described specifically below, but it must be noted that the invention is not limited by these embodiments alone.

[Measurement of Number-Average Molecular Weight]

Number-average molecular weight of synthesized (meth) acrylic polymer was measured in the following method. By dissolving the synthesized (meth)acrylic polymer in THF at 0.1 wt %, the number-average molecular weight was calculated by polystyrene conversion by using GPC (gel permeation chromatography). The measuring condition is as follows.

GPC apparatus: HLC-8210GPC of Tosoh corporation
Column: (GMHHR-H)+(GMHHR-H)+(G2000HHR) of Tosoh corporation
Flow rate: 0.8 ml/min
Concentration: 0.1 wt %
Injection: 100 μl
Column temperature: 40° C.
Eluate: THF

[Measurement of Extinction Coefficient]

To determine the extinction coefficient of adhesive sheet and workpiece, absorbance at wavelength 532 nm was measured by using spectrophotometer (U-3410 manufactured by Hitachi Ltd., and it was calculated from the absorbance.

Example 1

Acrylic adhesive solution (1) was applied and dried on a base material (thickness 50 μm) made of ethylene-vinyl acetate copolymer, and an adhesive layer (thickness 10 μm) was formed, and an adhesive sheet for laser processing was obtained. Extinction coefficient of adhesive sheet was 8.6 cm$^{-1}$.

Acrylic adhesive solution (1) was prepared in the following method. Acrylic adhesive solution (1) was prepared by adding 100 parts by weight of acrylic polymer of number-average molecular weight of 800,000 prepared by copolymerization of butyl acrylate/ethyl acrylate/ 2-hydroxy ethyl acrylate/ acrylic acid at ratio by weight of 60/40/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate type cross-linking agent (Coronate L manufactured by Nippon Polyurethane Co.) to toluene, and dissolving and mixing uniformly.

The manufactured adhesive sheet for laser processing was adhered to one side of polyurethane sheet of 80 μm in thickness (extinction coefficient: 50.5 cm$^{-1}$) by means of a roll laminator, and a polyurethane sheet with adhesive sheet was fabricated. Extinction coefficient ratio was 0.17.

On an XY stage mounting glass epoxy resin adsorption board, the polyurethane sheet with adhesive sheet was disposed with the adhesive sheet downside. Nd:YAG laser second harmonic (532 nm) of average output 5 W, and repetition frequency of 70 kHz was focused on the surface of polyurethane sheet in a diameter of 60 μm by fθ lens, and laser beam was scanned at speed of 20 mm/second by galvanoscanner to cut off. At this time, it was confirmed that polyurethane sheet was cut off, but the adhesive sheet was not processed at all. By emitting ultraviolet ray to adhesive sheet, the adhesive layer was cured. The adhesive sheet was peeled off, and the laser processing peripheral area of adhesive sheet adhering surface (laser beam exit side) of polyurethane sheet was observed, but decomposition product (deposit) of base material and adsorption board was not observed.

Comparative Example 1

Polyurethane sheet was processed by laser in the same procedure as in example 1, except that the adhesive sheet was not disposed at one side of polyurethane sheet. Peripheral area of processing at the laser beam exit side of polyurethane sheet was observed, and lots of decomposition products of polyurethane and decomposition products of glass epoxy resin used as adsorption board were observed. It was attempted to desmear by using aqueous solution of potassium permanganate, but deposits of decomposition products could not be removed completely.

Comparative Example 2

Adhesive sheet for laser processing was prepared in the same procedure as in example 1, except that a base material (thickness 100 μm) of polyethylene naphthalate was used instead of base material of ethylene-vinyl acetate copolymer. Extinction coefficient of adhesive sheet was 76.3 $cm^{-1}$.

The polyurethane sheet was cut and processed in the same manner as in example 1 except that the adhesive sheet for laser processing was used. Extinction coefficient ratio was 1.51. At this time, the polyurethane sheet was cut off, and the adhesive sheet was considerably processed. Foams were formed in the interface of polyurethane sheet and adhesive sheet. The adhesive layer was cure by emitting ultraviolet ray to the adhesive sheet. Later, the adhesive sheet was separated, and the laser processing peripheral area of adhesive sheet adhering surface (laser beam exit side) of polyurethane sheet was observed, and much decomposition product polyethylene naphthalate of base material was observed.

Example 2

Adhesive sheet for laser processing was manufactured in the same procedure as in example 1, except that base material of polymethyl methacrylate (thickness 100 μm) was used instead of ethylene-vinyl acetate copolymer. The extinction coefficient of adhesive sheet was 1.7 $cm^{-1}$.

Using the adhesive sheet for laser processing, it was cut and processed in the same manner as in example 1, except that silicon wafer (thickness 75 μm) was used instead of polyurethane sheet as material to be processed. At this time, silicon wafer was cut off, but the base material of adhesive sheet was not processed at all. Ultraviolet ray was emitted to adhesive sheet, and adhesive layer was cured. The adhesive sheet was peeled off, and the laser processing peripheral area of adhesive sheet adhering surface (laser beam exit side) of silicon wafer was observed, but decomposition product (deposit) of base material and adsorption board was not observed.

As clear from the examples and comparative examples, by selecting and using an adhesive sheet of which extinction coefficient ratio is less than 1, contamination of the workpiece surface by decomposition product can be effectively suppressed. When processing a metal material, by using an adhesive sheet of which extinction coefficient is less than 20 $cm^{-1}$, contamination of metal material surface by decomposition product can be effective prevented. As a result, the subsequent process of removal of decomposition product can be substantially simplified, and hence it contributes not only to reduction of environmental impact, but also to enhancement of productivity. Further, since deposits of decomposition product can be avoided, the laser power is heightened, and the throughput can be enhanced.

What is claimed is:

1. A method of manufacturing a laser processed part using an adhesive sheet for laser processing having at least an adhesive layer on a base material, with an extinction coefficient ratio less than 1, the extinction coefficient ratio being an extinction coefficient of adhesive sheet for laser processing at wavelength 532 nm divided by an extinction coefficient of a workpiece to be processed at wavelength 532 nm, wherein the base material is made of a resin without containing aromatic hydrocarbon group, the method comprising the steps of:
selecting the adhesive sheet on the basis of the adhesive sheet possessing an extinction coefficient ratio of less than 1;
adhering the adhesive layer of the adhesive sheet for laser processing to a laser beam emitting side of the workpiece;
processing the workpiece by irradiating a laser beam at wavelength 532 nm and at a power output sufficient to cut through the entire workpiece, wherein the adhesive sheet is not cut; and
removing the adhesive sheet for laser processing from the processed workpiece.

2. The method of manufacturing a laser processed part according to claim 1, wherein
the workpiece is one of a sheet material, a circuit board, a semiconductor wafer, a glass substrate, a ceramic substrate, a metal substrate, a semiconductor laser light emitting or receiving element substrate, an MEMS substrate, and a semiconductor package.

3. The method of manufacturing a laser processed part according to claim 1, wherein the processing is cutting or drilling.

4. The method of manufacturing a laser processed part according to claim 1, wherein the irradiating consists of irradiating with a laser at wavelength 532 nm.

5. The method of manufacturing a laser processed part according to claim 1, wherein said method further comprises:
selecting an adhesive sheet on the basis of possessing the property of suppressing contamination of a workpiece when the workpiece is processed with a laser at 532 nm.

6. A method of manufacturing a laser processed part, comprising:
selecting an adhesive sheet on the basis of the adhesive sheet possessing an extinction coefficient ratio of less than 1 which is an extinction coefficient of the adhesive sheet at a wavelength of 532 nm divided by an extinction coefficient of a workpiece-to-be-processed at a wavelength of 532 nm;
providing said adhesive sheet, wherein said adhesive sheet comprises a base material and an adhesive layer formed thereon, said adhesive sheet having an extinction coefficient ratio of less than 1, wherein the base material is made of a resin without containing aromatic hydrocarbon group;

adhering the adhesive layer of the adhesive sheet to a laser beam emitting side of the workpiece-to-be-processed;

processing the workpiece-to-be-processed by irradiating a laser beam at wavelength 532 nm and at a power output sufficient to cut through the entire workpiece to obtain a processed workpiece, wherein the adhesive sheet is not cut; and removing the adhesive sheet from the processed workpiece.

7. The method according to claim 6, wherein the workpiece-to-be-processed is selected from the group consisting of a sheet material, a circuit board, a semiconductor wafer, a glass substrate, a ceramic substrate, a metal substrate, a semiconductor laser light emitting or receiving element substrate, an MEMS substrate, and a semiconductor package.

8. The method according to claim 6, wherein the processing step comprises cutting or drilling.

* * * * *